United States Patent [19]

Kaufman et al.

[11] Patent Number: 5,235,279
[45] Date of Patent: Aug. 10, 1993

[54] MRI USING AUXILIARY INSERT GRADIENT COIL TO PRODUCE INTENSE AUXILIARY MAGNETIC GRADIENT PULSES

[75] Inventors: Leon Kaufman, San Francisco; Joseph W. Carlson, Kensington; Hector E. Avram, Foster City, all of Calif.

[73] Assignee: The Regents of the University of California, Oakland, Calif.

[21] Appl. No.: 837,317

[22] Filed: Feb. 19, 1992

[51] Int. Cl.$^5$ .............................................. G01V 3/00
[52] U.S. Cl. .................................... 324/309; 324/318
[58] Field of Search ............... 324/307, 309, 314, 318, 324/319, 320, 322

[56] References Cited

U.S. PATENT DOCUMENTS 4,924,186 5/1990 Kawamoto et al. ................ 324/320
5,122,748 6/1992 Oh et al. ............................. 324/309

OTHER PUBLICATIONS

Crooks et al, "Echo-Planar Pediatric Imager", Radiology, 1988; vol. 166, No. 1, pp. 157–163.
Roemer et al, "High Speed, High Field, Planar Surface Gradient Assembly for Fast Imaging", SMRM, 1988; p. 134.
Yi et al, "Three Channel Surface Gradient Coil for High Resolution NMR Imaging", SMRM, 1990, p. 201.
Hajnal et al, "An Insert Gradient Coil Unit for Anisotropic Diffusions Studies of the Brain", JMRI, vol. 1, No. 2, Mar./Apr. 1991, p. 209.

Primary Examiner—Louis Arana
Attorney, Agent, or Firm—Nixon & Vanderhye

[57] ABSTRACT

An auxiliary insert MRI gradient coil is used to produce intense auxiliary magnetic gradient pulses during MRI sequences to improve MRI system performance. Although the auxiliary gradient coil may be of considerably reduced dimensions, thus, having considerably reduced uniformity, linearity and/or reproducibility than standard MRI gradient coils, coordinated use of both the regular MRI gradient coils and the auxiliary gradient coil can produce considerably enhanced MRI system performance in certain applications. Such auxiliary magnetic gradient coil may be used, for example, to provide spoiler pulses between MRI spin echo subsequences, as diffusion gradient pulses in diffusion MRI studies or as the oscillating gradient used to form successive gradient echoes in echo planar imaging.

31 Claims, 4 Drawing Sheets (SPOILER PULSE)

(DIFFUSION MRI)

(ECHO PLANAR)

MRI USING AUXILIARY INSERT GRADIENT COIL TO PRODUCE INTENSE AUXILIARY MAGNETIC GRADIENT PULSES

FIELD OF THE INVENTION

This invention generally relates to magnetic resonance imaging (MRI) utilizing nuclear magnetic resonance (NMR) phenomena. It more particularly relates to an improved MRI system incorporating an auxiliary magnetic gradient coil driven to produce intense auxiliary magnetic gradient pulses in conjunction with the usual magnetic gradient coils included in an MRI system during a common MRI data acquisition sequence.

RELATED ART

MRI is by now a well-known and commercially available non-invasive procedure for obtaining diagnostic information about the internal structure of living tissue. In very brief summary, NMR nuclei (e.g., a significant proportion of hydrogen nuclei in the human body) are nominally aligned with an intense superimposed static homogeneous magnetic field $B_o$. By applying predetermined sequences of NMR RF nutation pulses and magnetic gradient pulses of selected duration and in selected directions (e.g., to selectively cause transient gradients in the $B_o$ magnetic field along the usual orthogonal x, y, z coordinate directions), some of these nuclei are disturbed in a predetermined manner from their quiescent orientations. As they tend to return to the quiescent orientation with the $B_o$ field, they emit characteristic spatially encoded RF signals which are detected, digitized and processed in known ways to produce a visual image representing the distribution of NMR nuclei (e.g., along selected planar "slice" volumes of the living tissue) within a predetermined image volume.

In conventional commercially available MRI systems, there are different geometries and coordinate systems used to practice MRI. For example, one common arrangement uses a solenoidal cryogenic super conducting electromagnet to produce the nominally static homogeneous quiescent magnetic field $B_o$ along a z axis centered within the bore of the solenoid. Another arrangement uses an array of permanent magnets and magnetic circuit yokes between enlarged pole pieces disposed above and below the image volume. In such whole-body MRI systems, the dimensions of the main magnet and of the associated gradient coils utilize relatively large scale geometry for a number of reasons. First of all, the system must be large enough to accommodate a human body (or at least the portion of the human body that is to be imaged). But, perhaps even more importantly, to obtain the required uniformity, linearity and/or reproducibility of magnetic fields within the image volume, the image volume must comprise a relatively small and limited portion of the entire volume bounded by such structures. Unfortunately, such relatively large dimensions lead to increased gradient coil inductance (and resistance) thus self-limiting the time responsiveness of such coils. The intensity of achievable magnetic fields generated in the relatively remote image volume is also thereby self-limited for a given drive current magnitude. Others have already recognized that smaller dimensioned gradient coils placed in closer proximity to the image volume may be quite helpful for certain applications. See, for example:

1. Crooks et al, "Echo-Planar Pediatric Imager", *Radiology*, 1988; Volume 166, No. 1, pp. 157-163;
2. Roemer et al, "High Speed, High Field, Planar Surface Gradient Assembly for Fast Imaging", *SMRM*, 1988; page 134;
3. Yi et al, "Three Channel Surface Gradient Coil for High Resolution NMR Imaging", *SMRM*, 1990, page 201; and
4. Hajnal et al, "An Insert Gradient Coil Unit for Anisotropic Diffusions Studies of the Brain", *JMRI*, Volume 1, No. 2, March/April 1991, pp. 209.

Of these approaches, Crooks et al, Yi et al, and Hajnal all appear to provide a smaller-dimensioned, but otherwise complete set of three gradient coils which are to be used alone and instead of the usual larger dimensioned set of gradient coils found in commercially available MRI systems. Roemer et al appear to substitute a surface gradient coil in the y dimension but do not appear to suggest using such auxiliary gradient coil in conjunction with magnetic gradient pulses in the same direction from the other larger dimensioned and standard gradient coils during a single MRI data acquisition sequence. Roemer et al also specifically teach only a planar (i.e., "flat") surface gradient coil structure so oriented that its flat construction does not interfere with the horizontal field of other MRI system components.

In many MRI applications, a strong gradient pulse is desirable—even if it is of reduced uniformity and/or linearity and/or reproducibility. We have now discovered that a smaller-dimensioned gradient coil can be used in conjunction with the usual larger-dimensioned gradient coils of an MRI system, during a common MRI data acquisition sequence, to provide improved operation and at lower than otherwise anticipated costs. For example, a relatively small auxiliary gradient coil insert can be used in conjunction with the standard MRI system to provide such strong gradient pulses at much lower cost than would otherwise be associated with attempts to pulse existing gradient coils to higher gradient magnitudes. Typically, the usual imaging sequence is carried out by the existing MRI system magnetic gradient coils while a small-diameter magnetic gradient coil provides relatively stronger gradient pulses at critical points within the same MRI sequence.

For example, relatively strong gradient pulses may be used to destroy unwanted phase coherence of NMR nuclei at certain points in an NMR sequence. Similar strong gradient pulses may be used as the diffusion gradient pulses in MRI diffusion studies.

SUMMARY OF THE INVENTION

Since gradient driver power demand increases with the square of the desired gradient magnitude, and as the fourth to fifth power of coil diameter and since power (as well as linearity and reproducibility specifications) greatly increase the costs of suitable gradient driver amplifiers, reducing the necessary power for reproducing a given gradient magnitude is quite important. We have discovered that such auxiliary gradient pulses can be produced at appropriate times within an MRI sequence by using a further (i.e., a fourth) inserted gradient coil specifically adapted to produce the desired strong gradient. By so doing, one avoids the need to provide enhanced driving power to an existing gradient driver channel already used for the usual imaging gradients (and which are therefore of the usual large-diameter so as to meet stringent specifications for uniformity, linearity, and reproducibility). Rather, a dedicated relatively low-cost gradient driver supply can be used in conjunction with the smaller diameter auxiliary gradient coil insert of this invention.

As mentioned above, the usual commercially available MRI system includes three magnetic gradient coils driven to produce substantially uniform linear magnetic gradient pulses within an image volume along each different (x, y, z) direction during an MR imaging sequence. This invention, in the exemplary embodiment, provides an improvement by including a further gradient coil driven to produce auxiliary gradient pulses along at least one of such directions within the same image volume during the same MR imaging sequence. In a preferred exemplary embodiment, the auxiliary coil is of cylindrical geometry and includes a self-shielding winding so as to magnetically decouple it from the remaining magnetic gradient coils of the usual MRI system. Typically, the auxiliary magnetic gradient coil will produce a magnetic gradient magnitude within the image volume that is of substantially greater magnitude than the gradient otherwise produced in that respective direction by the usual MRI system gradient coil.

The term "cylindrical" is used in its generic sense throughout this text to include not only right circular cylinders but to also include any cylindrical shape including cylinders having a non-circular cross-section.

Although the preferred exemplary embodiment uses a separate lower cost gradient driver for the auxiliary coil, it is also possible to time-share usage of one of the three conventionally supplied gradient coil drivers by utilizing a controllable multiplexed switch at its output to selectively drive either one of the usual MRI system gradient coils or the auxiliary magnetic gradient coil.

In the exemplary embodiment, the auxiliary gradient coil may be used to produce a spoiler pulse of magnetic gradient between repeated MR imaging sub-sequences to reduce residual NMR phase coherence between such subsequences. Alternatively, the auxiliary coil may be used to produce strong auxiliary gradient pulses in a read-out dimension during an echo planar MR imaging sequence (albeit the read-out direction in this exemplary embodiment is changed from the usual direction). Still further, the auxiliary coil of this invention may be utilized to produce strong pairs of magnetic gradient pulses bracketing NMR phase inversion pulses in an MRI diffusion imaging sequence.

BRIEF DESCRIPTION OF THE DRAWINGS

These as well as other objects and advantages of this invention will be more completely understood and appreciated by careful study of the following detailed description of presently preferred exemplary embodiments taken in conjunction with the accompanying drawings of which.

DETAILED DESCRIPTION OF THE EXEMPLARY EMBODIMENTS

Figure 1:
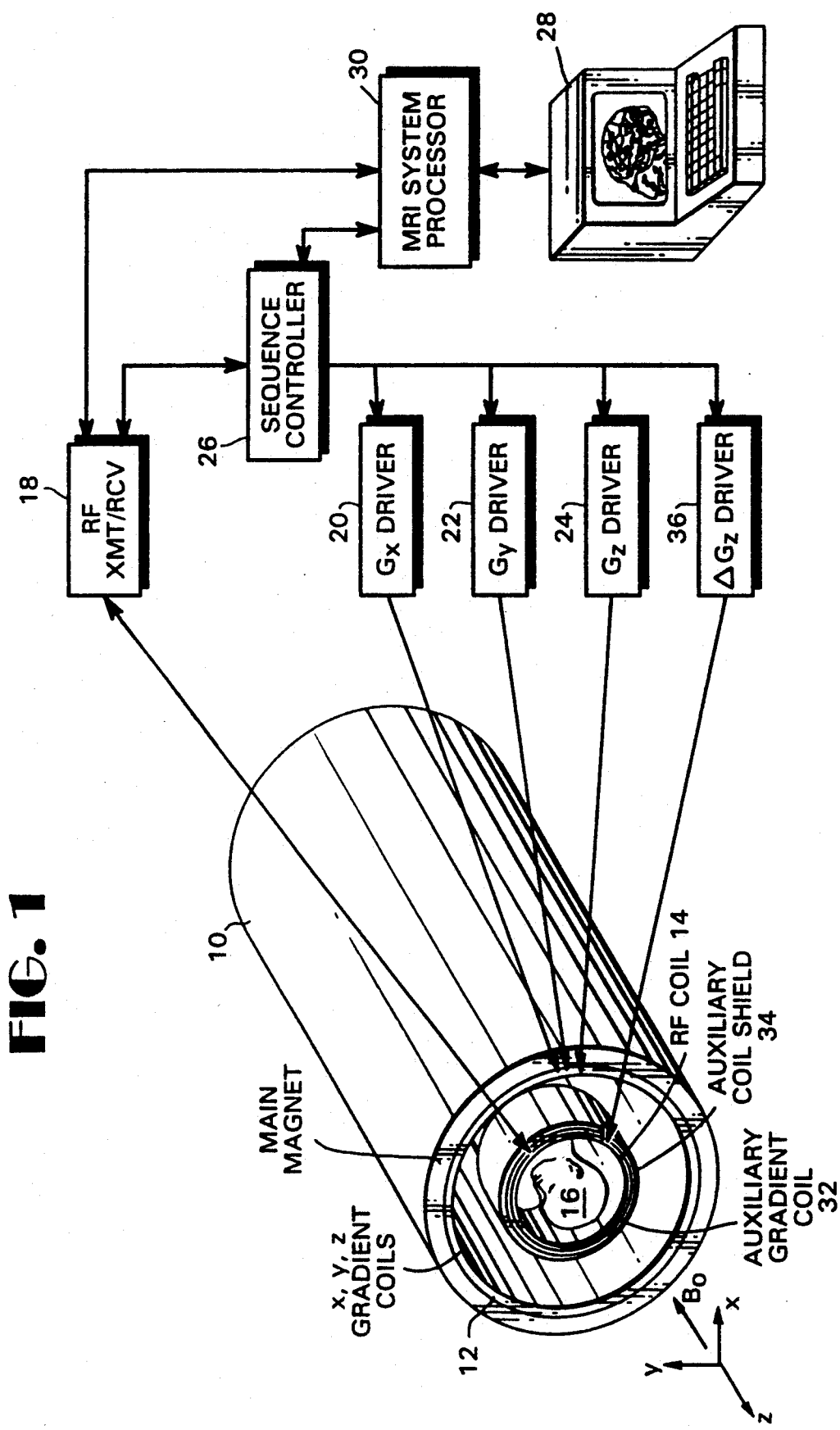
FIG. 1 is a schematic representation of an MRI system employing an exemplary self-shielded cylindrical auxiliary magnetic gradient coil and its associated independently controllable lower, cost drive circuit.

FIG. 1 schematically illustrates an MRI system employing a gradient coil in accordance with an exemplary embodiment of this invention. As those in the art will appreciate, the FIG. 1 depiction is very schematic and omits much complexity so as not to obfuscate important features of this invention.

In such a typical MRI system, a quiescent uniform and static magnetic field $B_o$ may be created by the main solenoidal magnetic 10 (e.g., a cryogenic super conducting electromagnet). A set of three gradient coils 12 is then typically used for creating gradients in the main magnetic field along each of three mutually orthogonal coordinate directions x, y, z (e.g., by using a pair of Maxwell coils to cause a gradient in the z direction and pairs of saddle coils rotated at 90° with respect to one another to create gradients along the x and y directions). An RF coil 14 is tightly coupled to an interior image volume (e.g., containing a patient's head 16) for transmitting and receiving NMR RF signals into and out of the image volume.

The RF coil 14, (or in some applications separate transmit and receive RF coils) are connected to suitable transmit and receive RF circuitry 18 as will be appreciated by those in the art. The gradient coils 12 are individually driven by the usual $G_x$, $G_y$, and $G_z$ gradient drivers 20, 22, and 24. The sequencing of the gradient drivers and of RF transmit/receive operations is typically controlled by a preprogrammed sequence controller 26 which is, in turn, under control of a human operator via console 28 and the remainder of the typical MRI system (e.g., processor 30 which ultimately receives RF signal responses from the image volume and converts them into a suitable visual image that may be displayed, photographed or otherwise recorded for medical diagnostic purposes).

In addition to the conventional MRI system components heretofore explained with respect to FIG. 1, the exemplary embodiment of this invention depicted in FIG. 1 includes an auxiliary gradient coil 32 with its outer shield winding 34. The auxiliary self-shielded gradient coil 32 is, in this exemplary embodiment, selectively and controllably driven by a lower cost driver circuit 36. That is, the sequence controller 26 may at any desired programmable times in a given MRI sequence activate auxiliary coil driver 36 for generating selected current driver magnitudes and durations of auxiliary gradient pulses.

Alternatively, one of the traditional already existing drivers 20, 22, or 24 may be utilized to drive the auxiliary gradient coil 32 with its outer shield winding 34 via a suitable controlled multiplex switch at its output. In this way, sequence controller 26 may selectively chose whether a particular driver excites the auxiliary coil winding or the winding of its respectively associated traditional gradient coil. Of course, in this alternative embodiment, the driver involved could not simultaneously drive both the auxiliary gradient coil winding and those of its otherwise associated traditional gradient coil. Nevertheless, by suitable multiplexed control of the gradient driver output, the auxiliary gradient coil 32 with its outer shield winding 34 can be suitably pulsed at selected times within a given MRI sequence while, at other times in that same sequence, the same driver can be used to suitably pulse the other traditional gradient coil.

Figure 2:
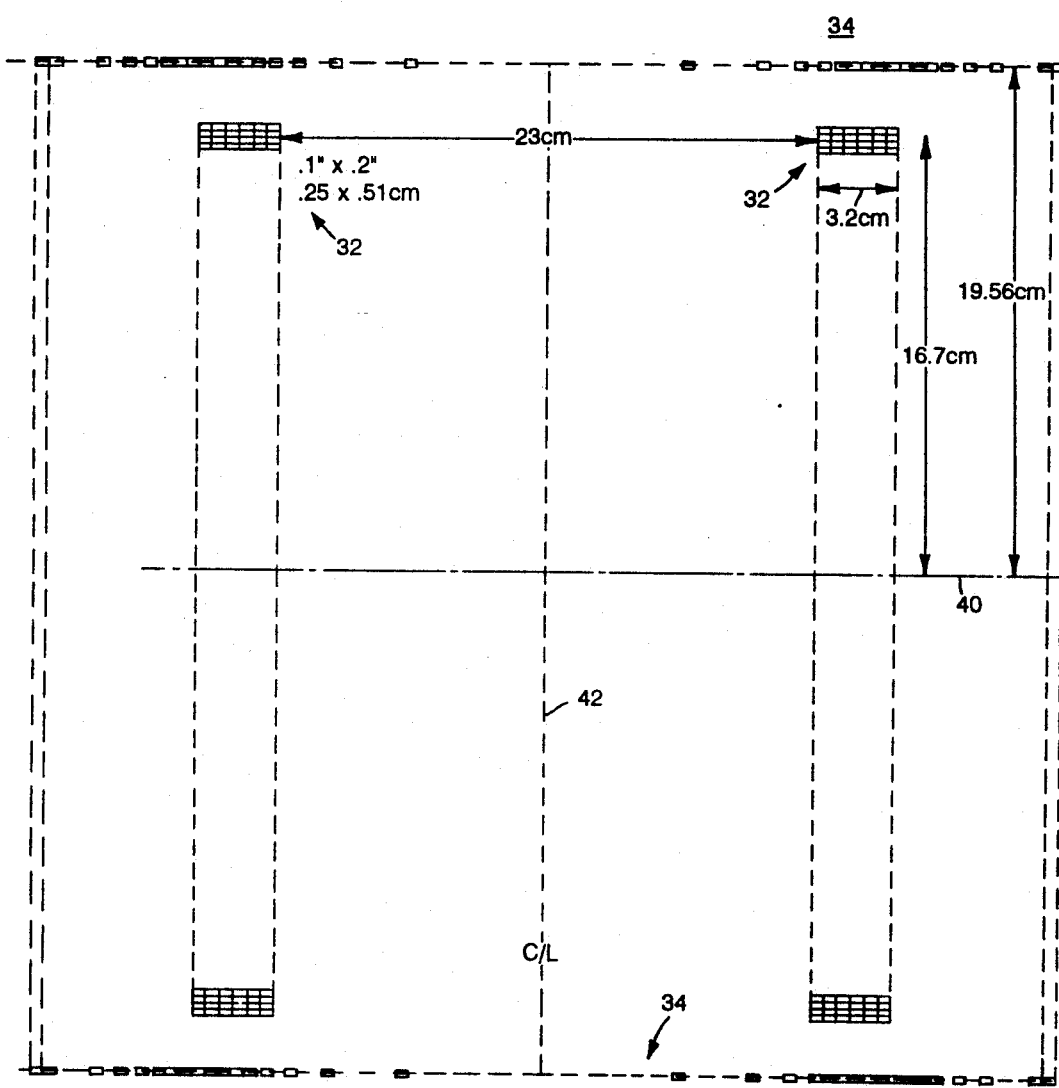
FIG. 2 is a schematic cross-sectional depiction of the self-shielded auxiliary magnetic gradient coil shown in FIG. 1.

The exemplary auxiliary gradient coil 32 and its included auxiliary shield winding 34 are depicted schematically in cross-section in considerably more detail at FIG. 2. FIG. 2 depicts the exemplary coil 32 as though it had been sliced by a plane through its cylindrical axis. The example shown happens to be a right circular cylinder. The dimensions depicted in FIG. 2 have been found suitable for an auxiliary gradient coil used in conjunction with a point 0.35 Tesla field $B_o$. As depicted in FIG. 1, the cylindrical coil of FIG. 2 is typically located just outside a suitable RF coil (e.g., a quadrature detection head coil). As will be appreciated by those in the art, the serially connected auxiliary coil shield windings 34 are wound to produce a magnetic field opposite to that produced by the auxiliary gradient coil windings 32 outside the auxiliary coil shield winding 34. In this manner, when the auxiliary gradient coil is pulsed, there should be little or no coupling to the main magnetic gradient coils. As those in the art will appreciate, the design of a suitable self-shielded Maxwell coil per se is well known.

The individual wires used in the exemplary auxiliary gradient coil are of rectangular cross-section approximately 0.1 inch by 0.2 inch (i.e., approximately 0.25 cm by 0.51 cm). Adjacent turns of such wires are, of course, suitably insulated from one another. The auxiliary gradient coil 32 includes a pair of primary windings (Maxwell connected) cylindrically disposed with respect to axis 40 and symmetrically disposed with respect to a perpendicular center plane 42. Each such primary winding includes four layers of six turns per layer of copper wires. The mean radius and the coil-to-coil separation dimensions are as depicted for the exemplary embodiment in FIG. 2. The self-shield winding 34 includes thirty-four turns disposed at a larger radius 40 and suitably spaced so as to achieve the desired self-shielding function. For example, in the exemplary embodiment depicted in FIG. 2, the symmetrical distances from center plane 42 for the seventeen turns located to either side thereof are, in centimeters, approximately: 5.3, 8.2, 9.6, 10.5, 11.2, 11.7, 12.2, 12.7, 13.2, 13.7, 14.2, 14.7, 15.3, 16.1, 17.2, 19.0, and 19.5.

Figure 3:
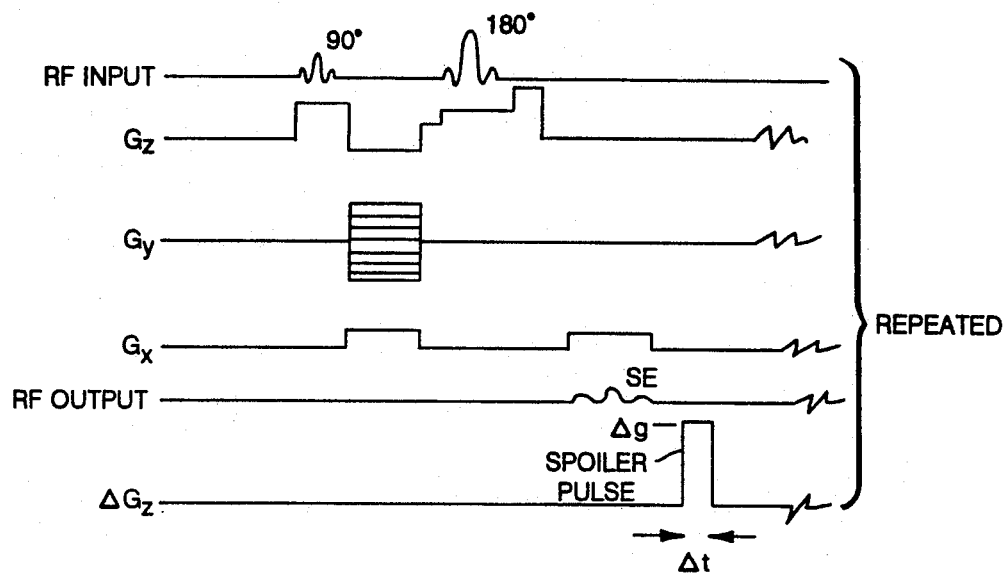
FIG. 3 schematically depicts an MRI sequence in which intense auxiliary magnetic gradient pulses from the auxiliary coil in FIG. 1 are used as spoilers between sub-sequences.

The first five lines of FIG. 3 depict a standard spin echo MRI subsequence. Here, a 90° pulse is applied during a slice-selective $G_z$ magnetic gradient so as to initially nutate NMR nuclei within a selected slice volume. Thereafter, a phase-encoding $G_y$ gradient of selected magnitude and polarity is applied so as to create spatial-encoding in the y-dimension. Various conventional error-correcting gradient pulses in the $G_z$ and the $G_x$ dimensions may also be employed during this intermediate time interval. Then a 180°, (i.e., phase inverting) RF nutation pulse is applied (again during a slice-selective $G_z$ magnetic gradient pulse) before a spin echo RF output is created (in accordance with the "rule of equal times"). Spatial encoding in the x-dimension is generated by applying a $G_x$ magnetic gradient pulse during the time the spin echo RF output occurs and is detected and sampled by the usual MRI system RF circuitry. Especially for shorter TR intervals in substandard multi-slice MRI sequences, it is desirable to "spoil" any remaining phase coherence at the conclusion of each sub-sequence interval (as depicted in FIG. 3) before the entire sub-sequence is repeated for the same or different slice volume(s) in rapid succession. The exemplary auxiliary gradient coil of this invention is capable of delivering a very strong and fast auxiliary gradient in the z-axis direction (e.g., as much as six Gauss per centimeter can be achieved in as little as one millisecond) while generating negligible eddy currents (because it is self-shielded). A typical spoiler pulse as depicted in FIG. 3 may use the maximum intensity of six Gauss per centimeter and a duration on the order of 10 milliseconds (e.g., assuming a sub-sequence of approximately 100 to 150 milliseconds).

Figure 4:
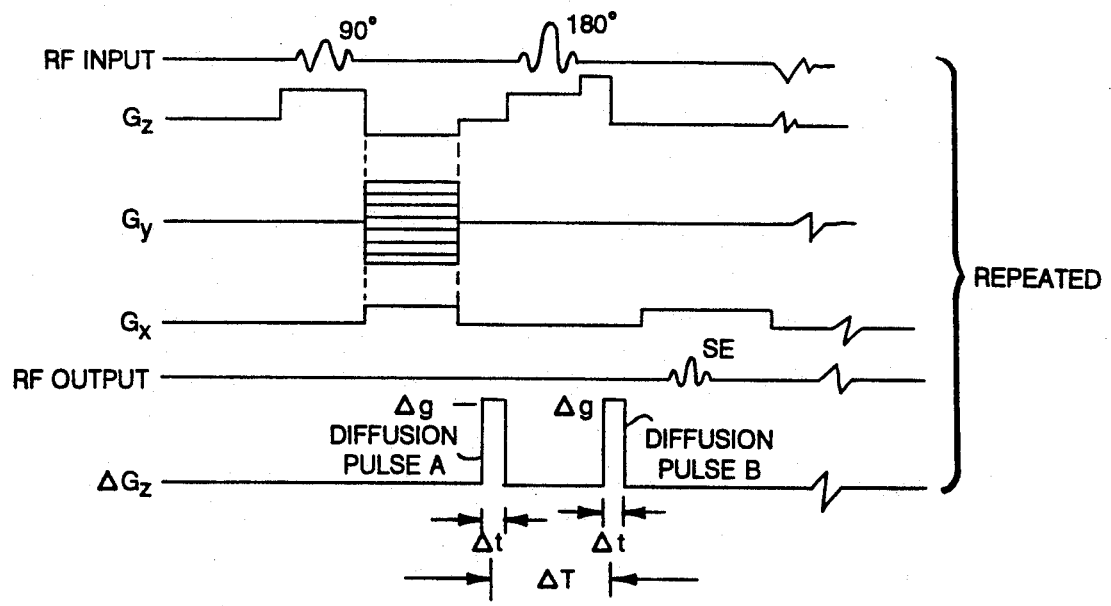
FIG. 4 is a schematic depiction of an MRI sequence wherein the auxiliary gradient coil of FIG. 1 is used to produce pairs of diffusion gradient pulses useful in studying tissue diffusion by MRI.

FIG. 4 depicts a different application for the auxiliary gradient coil. Here, in a typical diffusion study, a standard MRI sequence is used to generate one image and then a modified MRI sequence (e.g., using diffusion gradient pulses) is utilized so as to obtain a comparative image of the same volume. As depicted in FIG. 4, diffusion gradient pulses A and B bracket the 180° nutation pulse in a typical modified spin echo MRI sequence. It is desired to attenuate the signal corresponding to diffusing liquids so that when the two images are compared, the diffusing liquid can be readily ascertained. In a typical application where the auxiliary gradient magnitude is approximately 5 Gauss per centimeter, the pulse durations are each approximately 10 milliseconds and the separation between diffusion pulses A and B is on the order of 30 milliseconds and where the liquid in the tissue of interest has a diffusion constant of approximately 0.6 to $1.7 \times 10^{-5}$ square centimeters per second, an attenuation factor of approximately 50% may be achievable. These parameters are particularly suited for measuring the diffusion of blood within typical head geometries and tissues. Although both large magnitude and large pulse duration may be desirable from some perspectives, large pulse duration implies loss of signal-to-noise ratio and therefore, where choices are possible, it is presently preferred to use a relatively larger auxiliary gradient magnitude and a relatively shorter pulse duration.

Figure 5:
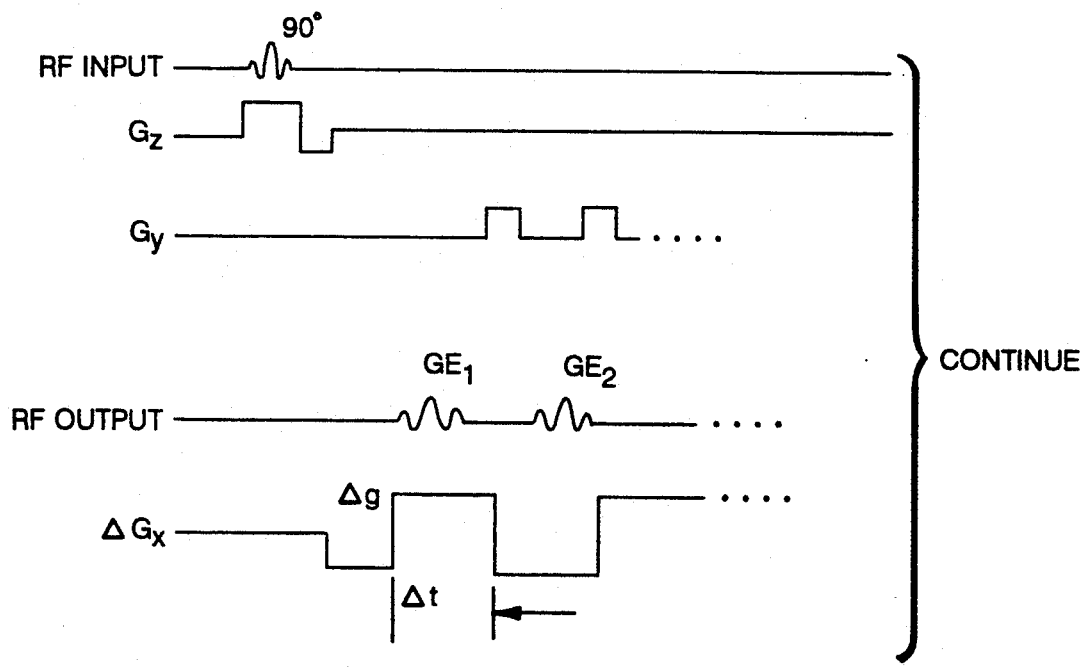
FIG. 5 is a schematic depiction of an echo planar MRI sequence utilizing the auxiliary gradient coil of FIG. 1 to induce successive gradient echoes.

FIG. 5 depicts a possible echo planar MRI application for the auxiliary gradient pulse coil of this invention. Here, the intense gradient field available from the auxiliary coil is utilized in the usual oscillating fashion so as to generate a succession of gradient echoes (GE) subsequent to an initial 90° nutation pulse (slice-selective via $G_x$) and with successive phase encoding in the y dimension via $G_y$ (since, in this exemplary embodiment, the read-out direction is changed from the usual x-axis direction to the z axis direction).

As will be appreciated, by permitting the MRI system to utilize both the regular large-dimensioned gradient coils and the smaller-dimensioned auxiliary gradient coil during a common MRI sequence, there are many opportunities for enhanced MRI system performance at relative small added cost. By making the auxiliary coil self-shielding, mutual inductance between the auxiliary gradient coil and the usual magnetic gradient coils can be greatly reduced and essentially eliminated so that when any one of the gradient coils is pulsed, there is no back EMF produced in the other gradient coils.

In effect, the auxiliary gradient coil of this invention provides for improved MRI system performance for many special applications (e.g., spoiling pulses, fast imaging sequences, diffusion studies, etc.). It permits shorter times to echo (TE) which improves signal-to-noise ratios in diffusion images. It also achieves these results at greatly reduced costs per unit magnitude of available magnetic gradient. Whereas typical standard MRI system gradient coils produce gradients having magnitudes in the range of zero to one Gauss per centimeter in the image volume, the exemplary embodiment is capable of producing an auxiliary gradient along the z axis dimension as much as six Gauss per centimeter. The auxiliary gradient coil provides the possibility of stronger and shorter gradient pulses (for spoilers, diffusion pulses, fast imaging, etc.) that may even be impossible to obtain with standard larger diameter gradient coil structures (e.g., as are typically utilized so as to obtain the desired degree of spatial homogeneity in the gradient fields). Here there are two options: (1) spatially calibrate the gradient field or (2) use a distributed primary coil winding 32. Although the auxiliary gradient produced by this invention will typically not be as spatially homogeneous (in the non-gradient dimension) as those generated by standard gradient coil structures, such spatial homogeneity is not required for auxiliary pulse applications such as those mentioned above utilized in conjunction with and in addition to the usual imaging gradient pulses. Such simultaneous dual gradient coil operations (e.g., using both the large and small diameter gradient), are facilitated by minimizing their mutual inductance (e.g., by the self-shielding arrangement mentioned above).

As will now be appreciated, this invention can be used to realize a combination of mutually advantageous benefits (including all subcombinations):

a less powerful gradient coil driver may be utilized to achieve a given gradient magnitude; and/or a given gradient coil driver may be used to attain increased gradient magnitude; and/or a given gradient coil driver can be used to attain shorter transient rise times.

For example, if the coil insert is used for slice selection (where nonuniformities may be less noticeable), then a five times more intense qradient may be achieved in much shorter times. That is, for example, if the usual slice select sub-sequence includes a 10 ms positive slice select gradient pulse followed by a 5 ms phase correction gradient pulse at magnitude G, then this invention may be used to produce a 5G gradient during a 2 ms positive slice select gradient pulse followed by a 1 ms phase correction gradient pulse (thereby reducing a 15 ms event to 3 ms).

While only a few specific exemplary embodiments of this invention have been described in detail, those skilled in the art will readily appreciate that many variations and modifications may be made in these exemplary embodiments while yet retaining many of the novel features and advantages of this invention. Accordingly, all such modifications and variations are intended to be included within the scope of the appended claims.

What is claimed is:

1. In an MRI system having plural first magnetic gradient coils driven to produce substantially uniformly linear magnetic gradient pulses within an image volume along each of plural different directions during an MR imaging sequence, the improvement comprising:

a further magnetic gradient coil of substantially smaller dimensions than said first magnetic gradient coils and driven to produce auxiliary magnetic gradient pulses along at least one of said directions within said image volume during and as part of said MR imaging sequence.

2. An improved MRI system as in claim 1 wherein sad plural first magnetic gradient coils comprise three gradient coils symmetrically disposed with respect to a main magnet structure and adapted for producing substantially linear magnetic gradients within said image volume along mutually orthogonal x, y and z directions.

3. An improved MRI system as in claim 2 wherein said further magnetic gradient coils produce a magnetic gradient within said image volume that is predominantly linear, but which, due to its relatively smaller size, includes substantial non-linear components within said image volume.

4. An improved MRI system as in claim 1 wherein said further magnetic gradient coil produces a magnetic gradient that is of a substantially greater magnitude than the gradient otherwise produced along its respective gradient-producing direction by one of said first gradient coils.

5. An improved MRI system as in claim 1 wherein said further magnetic gradient coil produces a magnetic gradient having a shorter rise time than that otherwise produced along its respective gradient-producing direction by one of said first gradient coils.

6. An improved MRI system as in claim 1 wherein said further magnetic gradient coil is driven by a current source of less magnitude than that used to drive any one of said first gradient coils.

7. An improved MRI system as in claim 3 wherein said further magnetic gradient coil produces a magnetic gradient that is of a substantially greater magnitude than the gradient otherwise produced along its respective gradient-producing direction by one of said first gradient coils.

8. An improved MRI system as in claim 3 wherein said further magnetic gradient coil produces a magnetic gradient having a shorter rise time than that otherwise produced along its respective gradient-producing direction by one of said first gradient coils.

9. An improved MRI system as in claim 3 wherein said further magnetic gradient coil is driven by a current source of less magnitude than that used to drive any one of said first gradient coils.

10. An improved MRI system as in claim 1 wherein all said magnetic gradient coils are of cylindrical form and wherein said further magnetic gradient coil is of substantially lesser maximum cross-sectional dimension than the remaining first gradient coils.

11. An improved MRI system as in claim 1 wherein said further magnetic gradient coil is of smaller dimensions that the remaining first gradient coils and wherein said further magnetic gradient coil can be selectively inserted within said first coils for use in selected MR imaging sequences or otherwise selectively omitted from the MRI system.

12. An improved MRI system as in claim 1 further comprising an independently controlled gradient driver for each gradient coil including a driver for said further magnetic gradient coil.

13. An improved MRI system as in claim 1 wherein each of said plural magnetic gradient coil is driven by an independently controlled driver circuit and further comprising at least one controllable multiplex switch selectively connecting the output of one of at least one said drivers to drive said further magnetic gradient coil.

14. An improved MRI system as in claim 1 wherein said further magnetic gradient coil is driven to produce a spoiler pulse of magnetic gradient between repeated MR imaging sequences to reduce residual NMR phase coherence between such sub-sequences.

15. An improved MRI system as in claim 1 wherein said further magnetic gradient coil is driven to produce auxiliary gradient pulses in a read-out dimension during an echo-planar MR imaging sequence.

16. An improved MRI system as in claim 1 wherein said further magnetic gradient coil is driven to produce pairs of magnetic gradient pulses bracketing NMR phase inversion pulses in a MR diffusion imaging sequence.

17. An improved MRI system as in claim 1 wherein said further magnetic gradient coil includes a self-shielding winding to magnetically de-couple it from the remaining first magnetic gradient coils.

18. An MRI system comprising:
a main magnet producing a static substantially homogeneous background magnetic field in a z-axis direction within an image volume;
a set of three magnetic gradient coils, $G_x$, $G_y$, $G_z$, each capable of producing a substantially uniformly linear gradient in the background field along a respective one of three orthogonal x, y and z axis directions within the image volume;
an auxiliary magnetic gradient coil $G_a$ of substantially smaller size that said $G_x$, $G_y$, $G_z$ gradient coils, said auxiliary coil being capable of producing an auxiliary gradient in the background field along at least one of said x, y and z axis directions within the image volume, said auxiliary gradient being of greater magnitude and less uniform linearity in the image volume than those produced by the $G_x$, $G_y$ and $G_z$ gradient coils due to the relatively smaller size of the auxiliary coil; and
gradient coil driver means for selectively driving each of the four gradient coils $G_x$, $G_y$, $G_z$, $G_a$ during a single MRI sequence in which data is acquired for creating an MR image.

19. An MRI system as in claim 18 wherein said auxiliary magnetic gradient coil $G_a$ includes a self shielding winding to reduce magnetic coupling to any of the three other gradient coils $G_x$, $G_y$, $G_z$.

20. An MRI system as in claim 18 wherein all said magnetic gradient coils $G_x$, $G_y$, $G_z$, $G_a$ are of cylindrical shape, said coils $G_x$, $G_y$ and $G_z$ having a maximum cross-sectional dimension that is substantially greater than the diameter of the $G_a$ coil.

21. An MRI system as in claim 18 wherein said gradient coil drive means comprises four individual gradient coil driver amplifiers.

22. An MRI system as in claim 18 wherein said gradient coil drive means comprises three individual gradient coil drive amplifiers and at least one multiplex output steering switch for selectively steering a corresponding amplifier output to one of the coils $G_x$, $G_y$, $G_z$ or, alternatively, to the auxiliary coil $G_a$.

23. In an MRI method using plural first magnetic gradient coils symmetrically disposed with respect to a main magnet structure and driven to produce substantially uniformly linear magnetic gradient pulses within an image volume among each of plural different directions during an MR imaging sequence, the improvement comprising:
driving a further, substantially smaller size magnetic gradient coil to produce auxiliary magnetic gradient pulses along at least one of said directions within said image volume during said MR imaging sequence.

24. An improved MRI method as in claim 23 wherein said further magnetic gradient coil is driven to produce a magnetic gradient that is of a substantially greater magnitude than the gradient otherwise produced along its respective gradient-producing direction by one of said first gradient coils.

25. An improved MRI method as in claim 23 wherein each of said plural magnetic gradient coil is driven by an independently controlled driver circuit and wherein the output of one of at least one said drivers is selectively routed to drive said further magnetic gradient coil.

26. An improved MRI method as in claim 23 wherein said further magnetic gradient coil is driven to produce a spoiler pulse of magnetic gradient between repeated MR imaging sequences to reduce residual NMR phase coherence between such sub-sequences.

27. An improved MRI system 23 wherein said further magnetic gradient coil is driven to produce auxiliary gradient pulses in a read-out dimension during an echo-planar MR imaging sequence.

28. An improved MRI system 23 wherein said further magnetic gradient coil is driven to produce pairs of magnetic gradient pulses bracketing NMR phase inversion pulses in a MR diffusion imaging sequence.

29. An improved MRI method as in claim 23 wherein said further magnetic gradient coil includes a self-shielding winding which magnetically de-couples it from the remaining first magnetic gradient coils.

30. An MRI method comprising:
producing a static substantially homogeneous background magnetic field in a z-axis direction within an image volume;
producing a substantially uniformly linear gradient disposed symmetrically with respect to a background field generated by a main magnet structure, said linear gradient being along a respective one of three orthogonal x, y and z axis directions with the image volume at selected times within an MRI sequence; and
using an auxiliary coil substantially smaller than coils used for the linear gradients to produce an auxiliary gradient in the background field along at least one of said x, y and z axis directions within the image volume also at selected times within the same MRI sequence, said auxiliary gradient being of greater magnitude and less uniform linearity than those otherwise produced in the image volume.

31. An MRI method as in claim 30 wherein said auxiliary magnetic gradient is self shielded to reduce magnetic coupling to any of other gradient coils.

* * * * *